United States Patent
Piret et al.

(10) Patent No.: US 7,392,454 B2
(45) Date of Patent: Jun. 24, 2008

(54) ERROR LOCATING METHODS AND DEVICES FOR ALGEBRAIC GEOMETRIC CODES

(75) Inventors: Philippe Piret, Cesson-Sevigne (FR); Frédéric Lehobey, Rennes (FR); Philippe Le Bars, Thorigne-Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 333 days.

(21) Appl. No.: 11/012,092

(22) Filed: Dec. 16, 2004

(65) Prior Publication Data

US 2005/0188291 A1    Aug. 25, 2005

(30) Foreign Application Priority Data

Dec. 16, 2003   (FR)   .................... 03 14721

(51) Int. Cl.
*H03M 13/00*    (2006.01)
(52) U.S. Cl. .................................... 714/752
(58) Field of Classification Search ........ None
See application file for complete search history.

(56) References Cited

U.S. PATENT DOCUMENTS

| 5,341,385 | A | * | 8/1994 | Shirota | 714/784 |
| 5,905,739 | A | | 5/1999 | Piret et al. | 371/37.01 |
| 5,942,005 | A | * | 8/1999 | Hassner et al. | 714/784 |
| 6,256,763 | B1 | * | 7/2001 | Oh et al. | 714/784 |
| 6,438,112 | B1 | | 8/2002 | Piret et al. | 370/298 |
| 6,543,021 | B1 | | 4/2003 | Piret | 714/752 |
| 6,578,170 | B1 | | 6/2003 | Piret et al. | 714/758 |
| 6,578,171 | B1 | | 6/2003 | Braneci et al. | 714/786 |
| 6,631,172 | B1 | * | 10/2003 | Shokrollahi et al. | 375/340 |
| 6,634,007 | B1 | * | 10/2003 | Koetter et al. | 714/784 |
| 6,638,318 | B1 | | 10/2003 | Piret et al. | 718/781 |
| 6,766,489 | B1 | | 7/2004 | Piret et al. | 714/755 |
| 6,877,125 | B2 | | 4/2005 | Le Bars et al. | 714/755 |
| 6,898,251 | B2 | | 5/2005 | Le Bars et al. | 375/295 |

(Continued)

OTHER PUBLICATIONS

Van Lint, "*Algebraic Geometric Codes*", in "*Coding Theory and Design Theory*", 1st Part, *The IMA Volumes in Mathematics and Its Applications*, vol. 20, pp. 137-162, Springer-Verlag, Berlin, 1990.

(Continued)

*Primary Examiner*—Jacques Louis-Jacques
*Assistant Examiner*—Sam Rizk
(74) *Attorney, Agent, or Firm*—Fitzpatrick, Cella, Harper & Scinto

(57) ABSTRACT

Method and apparatus for decoding a one-point algebraic geometric code of dimension k and length n, in order to identify the position of the errors in a received word, the syndromes matrix S, of dimension $(n-k)\times(n-k)$ is defined, of which the elements $S_{ij}$ of each line i are calculated, for j between 1 and $w(i)$, where the boundary w is a decreasing function, using the syndrome s of the received word, as well as the matrix $S^*$ obtained by "extending" the matrix S, that is to say by calculating the value of certain elements $S^*_{ij}$ where j is greater than $w(i)$. This method makes it possible in certain favorable cases to find the erroneous positions of the received word when the number of errors is greater than $(n-k+1-g)/2$, even if it is not possible to calculate all the elements of $S^*$ conventionally required by a two-stage algorithm to perform that correction.

18 Claims, 4 Drawing Sheets

U.S. PATENT DOCUMENTS

| | | | | |
|---|---|---|---|---|
| 6,915,478 | B2* | 7/2005 | Cox | 714/784 |
| 7,039,853 | B2* | 5/2006 | Hsu et al. | 714/784 |
| 7,191,376 | B2* | 3/2007 | Yedidia | 714/751 |
| 2002/0071496 | A1 | 6/2002 | Ehrmann | 375/295 |
| 2002/0099997 | A1 | 7/2002 | Piret | 714/781 |
| 2003/0177430 | A1 | 9/2003 | Piret | 714/751 |
| 2004/0117719 | A1 | 6/2004 | Lehobey et al. | 714/781 |
| 2004/0194006 | A1 | 9/2004 | Piret et al. | 714/800 |
| 2005/0015704 | A1 | 1/2005 | Piret et al. | 714/781 |
| 2005/0138533 | A1 | 6/2005 | Le Bars et al. | 714/784 |
| 2005/0188291 | A1* | 8/2005 | Piret et al. | 714/752 |
| 2005/0204268 | A1* | 9/2005 | Piret et al. | 714/781 |
| 2005/0210357 | A1* | 9/2005 | Piret et al. | 714/752 |
| 2005/0257115 | A1* | 11/2005 | Piret et al. | 714/752 |

OTHER PUBLICATIONS

Høholdt et al., "*On the Decoding of Algebraic-Geometric Codes*", IEEE Transactions on Information Theory, vol. 41, No. 6, pp. 1589-1614, Nov. 1995.

Skorobogatov et al., "*On the Decoding of Algebraic-Geometric Codes*", IEEE Transactions on Information Theory, vol. 36, No. 5, pp. 1051-1060, Sep. 1990.

S. Sakata et al., "Generalized Berlekamp-Massey Decoding of Algebraic-Geometric Codes up to Half the Feng-Rao Bound", IEEE Transactions on Information Theory, vol. 41, No. 6, pt. 1, pp. 1762-1768, Nov. 1995.

M. O'Sullivan, "A Generalization of he Berlekamp-Massey-Sakata Algorithm", Jun. 15, 2001, XP002284491, pp. 1-25, URL: http://www.mathnet.or.kr/API/?Mlval=research_prof_papers_detail&u_id=Sulli/bmsalg6.ps>.

G. Feng et al., "Decoding Algebraic-Geometric Codes up to the Designed Minimum Distance", IEEE Transactions on Information Theory, vol. 39, No. 1, pp. 36-45, Jan. 1993.

R.E. Blahut, "Theory and Practice of Error Control Codes", Addison Wesley, US, XP002272858, pp. 94-96, Chapter 5.1: "Viewing a Code from an Extension Field", 1984.

R.E. Blahut, "Theory and Practice of Error Control Codes", Addison Wesley, US, XP002272857, pp. 119-123, Chapter 5.8: "The Binary Golay Code", 1983.

J.H. van Lint et al., "Algebraic Geometry Codes", Introduction to Coding Theory 3$^{rd}$ Edition, Chapter 10, Springer-Verlag, pp. 148-165, 1999.

I. Blake et al., "Algebraic-Geometry Codes", IEEE Press, US, IEEE Transactions on Information Theory, vol. 44, No. 6, pp. 2596-2618, Oct. 1998.

S. Sakata, "Extension of the Berlekamp-Massey Algorithm to N Dimensions", Academic Press, Inc., Information and Computation, vol. 84, No. 2, pp. 207-239, 1990.

* cited by examiner

| $i$ | $h_i$ | $w(i)$ |
|---|---|---|
| 1 | 1 | 16 |
| 2 | $X$ | 12 |
| 3 | $Y$ | 11 |
| 4 | $X^2$ | 8 |
| 5 | $XY$ | 7 |
| 6 | $Y^2$ | 6 |
| 7 | $X^3$ | 5 |
| 8 | $X^2Y$ | 4 |
| 9 | $XY^2$ | 3 |
| 10 | $Y^3$ | 3 |
| 11 | $X^4$ | 3 |
| 12 | $X^3Y$ | 2 |
| 13 | $X^2Y^2$ | 1 |
| 14 | $XY^3$ | 1 |
| 15 | $X^5$ | 1 |
| 16 | $X^4Y$ | 1 |

FIG. 2

| ρ ⇒ | 1<br>0 | X<br>4 | Y<br>5 | X²<br>8 | YX<br>9 | Y²<br>10 | X³<br>12 | YX²<br>13 | Y²X<br>14 | Y³<br>15 | X⁴<br>16 | YX³<br>17 | Y²X²<br>18 | Y³X<br>19 | X⁵<br>20 | YX⁴<br>21 | Y²X³<br>22 |
|---|---|---|---|---|---|---|---|---|---|---|---|---|---|---|---|---|---|
| 1   0 | $\alpha^7$ | $\alpha^2$ | $\alpha^{10}$ | $\alpha^3$ | $\alpha^0$ | $\alpha^6$ | $\alpha^0$ | $\alpha^{14}$ | $\alpha^0$ | $\alpha^2$ | $\alpha^1$ | $\alpha^5$ | $\alpha^{11}$ | $\alpha^{14}$ | $\alpha^7$ | 0 | ? |
| X   4 | | $\alpha^2$ | $\alpha^3$ | $\alpha^0$ | $\alpha^{14}$ | $\alpha^0$ | $\alpha^1$ | $\alpha^5$ | $\alpha^{11}$ | $\alpha^{14}$ | $\alpha^7$ | 0 | ? | | | | |
| Y   5 | | | $\alpha^{10}$ | $\alpha^0$ | $\alpha^6$ | $\alpha^0$ | $\alpha^{14}$ | $\alpha^0$ | $\alpha^2$ | $\alpha^1$ | $\alpha^5$ | $\alpha^{11}$ | $\alpha^{14}$ | $\alpha^6$ | ? | | |
| X²   8 | | | | $\alpha^3$ | $\alpha^0$ | $\alpha^{14}$ | $\alpha^0$ | $\alpha^1$ | $\alpha^5$ | $\alpha^{11}$ | $\alpha^{14}$ | $\alpha^7$ | 0 | ? | | | |
| YX   9 | | | | | $\alpha^0$ | $\alpha^{14}$ | $\alpha^0$ | $\alpha^5$ | $\alpha^{11}$ | $\alpha^{14}$ | $\alpha^7$ | 0 | ? | | | | |
| Y²   10 | | | | | | $\alpha^6$ | $\alpha^0$ | $\alpha^2$ | $\alpha^{11}$ | $\alpha^{14}$ | $\alpha^6$ | ? | | | | | |
| X³   12 | | | | | | | $\alpha^0$ | $\alpha^1$ | $\alpha^5$ | $\alpha^7$ | 0 | ? | | | | | |
| YX²   13 | | | | | | | | $\alpha^{14}$ | $\alpha^5$ | $\alpha^{11}$ | 0 | ? | | | | | |
| Y²X   14 | | | | | | | | | $\alpha^{14}$ | $\alpha^6$ | ? | | | | | | |
| Y³   15 | | | | | | | | | | $\alpha^2$ | $\alpha^1$ | $\alpha^{14}$ | $\alpha^6$ | ? | | | |
| X⁴   16 | | | | | | | | | | | $\alpha^5$ | 0 | ? | | | | |
| YX³   17 | | | | | | | | | | | | 0 | ? | | | | |
| Y²X²   18 | | | | | | | | | | | | $\alpha^{11}$ | ? | | | | |
| Y³X   19 | | | | | | | | | | | | | $\alpha^{14}$ | ? | | | |
| X⁵   20 | | | | | | | | | | | | | | | ? | | |
| YX⁴   21 | | | | | | | | | | | | | | | | ? | |
| Y²X³   22 | | | | | | | | | | | | | | | | | ? |

$$\underline{S} = [\alpha^7 \;\; \alpha^2 \;\; \alpha^{10} \;\; \alpha^3 \;\; \alpha^0 \;\; \alpha^6 \;\; \alpha^0 \;\; \alpha^{14} \;\; \alpha^0 \;\; \alpha^2 \;\; \alpha^1 \;\; \alpha^5 \;\; \alpha^{11} \;\; \alpha^{14} \;\; \alpha^7 \;\; 0]$$

FIG. 3

ERROR LOCATING METHODS AND DEVICES FOR ALGEBRAIC GEOMETRIC CODES

This application claims priority from French patent application No. 0314721, which is incorporated herein by reference.

FIELD OF THE INVENTION

The present invention concerns systems for communication or recording of data in which the data are subjected to a channel encoding in order to improve the fidelity of the transmission or storage. It concerns more particularly a decoding method, as well as the devices and apparatus adapted to implement this method.

BACKGROUND OF THE INVENTION

It will be recalled that channel "block encoding" consists, when the "codewords" sent to a receiver or recorded on a data carrier are formed, of introducing a certain level of redundancy in the data. More particularly, by means of each codeword, the information is transmitted that is initially contained in a predetermined number k of symbols taken from an "alphabet" of finite size q; on the basis of these k information symbols, calculation is made of a number n>k of symbols belonging to that alphabet, which constitute the components of the codewords: $v \equiv (v_0, v_1, \ldots, v_{n-1})$ (the symbol "≡" means "by definition"). The set of codewords obtained when each information symbol takes some value in the alphabet constitutes a sort of dictionary referred to as a "code" of "dimension" k and "length" n.

When the size q of the "alphabet" is a power of a prime number, the alphabet can be given the structure of what is known as a "Galois field" denoted $F_q$, of which the non-zero elements may conveniently be identified as each being equal to $\gamma^i$ for a corresponding value of i, where $i=1, \ldots, q-1$, and where γ is a primitive $(q-1)^{th}$ root of unity in $F_q$.

In particular, certain codes, termed "linear codes" are such that any linear combination of codewords (with the coefficients taken from the alphabet) is still a codeword. These codes may conveniently be associated with a matrix H of dimension (n−k)×n, termed "parity check matrix": a word v of given length n is a codeword if, and only if, it satisfies the relationship: $H \cdot v^T = 0$ (where the exponent T indicates the transposition); the code is then said to be "orthogonal" to the matrix H.

At the receiver, the associated decoding method then judiciously uses this redundancy to detect any transmission errors and if possible to correct them. There is a transmission error if the difference e between a received word r and the corresponding codeword v sent by the transmitter is non-zero.

More particularly, the decoding is carried out in two main steps.

The first step consists of associating an "associated codeword" with the received word. To do this, the decoder first of all calculates the vector of "error syndromes" $s = H \cdot r^T = H \cdot e^T$. If the syndromes are all zero, it is assumed that no transmission error has occurred, and the "associated codeword" will then simply be taken to be equal to the received word. If that is not the case, it is thereby deduced that the received word is erroneous, and a correction algorithm is then implemented which is adapted to estimate the value of the error e; the algorithm will thus provide an estimated value ê such that (r−ê) is a codeword, which will then constitute the associated codeword. Usually, this first step is divided into two substeps: first identification is made of what the components are in the received word whose value is erroneous, and then the corrected value of those components is calculated.

The second step simply consists in reversing the encoding method. In the ideal situation in which all the transmission errors have been corrected, the initial information symbols are thereby recovered.

It will be noted that in the context of the present invention, reference will often be made to "decoding" for brevity, to designate solely the first of those steps, it being understood that the person skilled in the art is capable without difficulty of implementing the second step.

The purpose of an error correction algorithm is to associate with the received word the codeword situated at the shortest Hamming distance from that received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to INT[(d−1)/2] (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance. It should also be noted that, when the chosen algorithm manages to propose a correction for the received word, that correction is all the more reliable (at least, for most transmission channels) the smaller the number of positions it concerns.

The capability of a correction algorithm to propose a correction of a received word is faithfully represented by the formula:

$$2t \leq \Delta,$$

où t where Δ is the number of erroneous symbols in the received word, and is a strictly positive integer which we will call the "solving capability" of the algorithm. If the value of (2t) is less than or equal to the solving capability, the correction algorithm will be capable of correcting the received word. If the value of (2t) is greater than the solving capability, the algorithm can:

either simply fail in its correction attempt, or be capable of proposing a correction of the received word; in this case, if that correction is accepted, the risk is taken of it being erroneous, i.e. that the codeword proposed is not in fact the word sent; clearly, the greater (2t) is with respect to Δ, the higher the risk.

Taking into account the above considerations concerning the minimum distance d of the code, the algorithm considered will be said to be "maximum" if $$\Delta = d-1,$$

and "sub-maximum" if $$\Delta < d-1.$$

Among known codes, "Reed-Solomon" codes may be cited, which are reputed for their efficiency. They are linear codes, of which the minimum distance d is equal to (n−k+1). The parity check matrix H of the Reed-Solomon code of dimension k and length n (where n is necessarily equal to (q−1) or a divisor of (q−1)) is a matrix with (n−k) lines and n columns, which has the structure of a Vandermonde matrix. This parity check matrix H may for example be defined by taking $H_{ij}=\alpha^{(i+1)j}$ ($0 \leq i \leq n-k-1$, $0 \leq j \leq n-1$), where $\alpha$ is an $n^{th}$ root of unity in $F_q$. For more details on Reed-Solomon codes, reference may for example be made to the work by R. E. Blahut entitled "*Theory and practice of error-control codes*", Addison-Wesley, Reading, Mass., 1983. If the parity check matrix H of dimension (n−k)×n of a Reed-Solomon code is replaced by a matrix H' obtained by deleting certain columns of H, the code orthogonal to H' is said to be a "shortened" Reed-Solomon code.

For modern information carriers, for example on computer hard disks, CDs ("compact discs") and DVDs ("digital video discs"), it is sought to increase the density of information. When such a carrier is affected by a physical defect such as a scratch, a high number of information symbols may be rendered unreadable. This problem may nevertheless be remedied by using a very long code. However, as indicated above, the length n of the words in Reed-Solomon codes is less than the size q of the alphabet of the symbols. Consequently, if a Reed-Solomon code is desired having codewords of great length, high values of q must be envisaged, which leads to costly implementations in terms of calculation and storage in memory. Moreover, high values of q are sometimes ill-adapted to the technical application envisaged. For this reason, it has been sought to build codes which naturally provide words of greater length than Reed-Solomon codes.

In particular so-called "algebraic geometric codes" or "Goppa geometric codes" have recently been proposed (see for example "*Algebraic Geometric Codes*" by par J. H. van Lint, in "*Coding Theory and Design Theory*" 1$^{st}$ part, *IMA Volumes Math. App.*, volume 20, Springer-Verlag, Berlin, 1990). These codes are constructed from a set of n pairs (x, y) of symbols belonging to a chosen Galois field $F_q$; this set of pairs is termed a "locating set". In general terms, there is an algebraic equation with two unknowns X and Y such that the pairs (x, y) of that locating set are all solutions of that algebraic equation. The values of x and y of these pairs may be considered as coordinates of points $P_j$ (where j=1, ..., n) forming an "algebraic curve". Furthermore, in the context of the present invention, the set of the pairs (x, y) having the same value of x will be said to constitute an "aggregate".

An important parameter of such a curve is its "genus" g. In the particular case where the curve is a simple straight line (the genus g s then zero), the algebraic geometric code reduces to a Reed-Solomon code. In certain cases, algebraic geometric codes make it possible to achieve a length equal to $(q+2g\sqrt{q})$, which may be very high; for example, with an alphabet length of 256 and a genus equal to 120, codewords are obtained of length 4096.

For a "one point" algebraic geometric code a parity check matrix is conventionally defined as follows: With every monomial $h \equiv X^s Y^t$, where s and t are positive integers or zero, a "weight" is associated (see below for details). If, for an integer $\rho \geq 0$, there is at least one monomial of which the weight is $\rho$, it is said that $\rho$ is an "achievable" weight. Let $\rho_1 < \rho_2 < \ldots < \rho_{n-k}$ be the (n−k) smallest achievable weights, and let $h_i$ (where i=1, ..., n−k) be a monomial of weight $\rho_i$. The element in line i and column j of the parity check matrix is equal to the monomial $h_i$ evaluated at the point $P_j$ (where, it may be recalled, j=1, ..., n) of the algebraic curve. Each point $P_j$ then serves to identify the j$^{th}$ component of any codeword.

Algebraic geometric codes are advantageous as to their minimum distance, and, as has been said, as to the length of the codewords, but they have the drawback of requiring decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capability of the decoder (see for example the article by Tom Høholdt and Ruud Pellikaan entitled "*On the Decoding of Algebraic-Geometric Codes*", IEEE Trans. Inform. Theory, vol. 41 no. 6, pages 1589 to 1614, November 1995).

It should be noted that for these algorithms, most often only a lower bound of their solving capability $\Delta$ is available, except in the "trivial" case of a maximum algorithm for correction of Reed-Solomon codes, called the "Berlekamp-Massey algorithm", for which the solving capability is precisely known and is equal to $\Delta = n-k$.

An algorithm for decoding algebraic geometric codes defined on a curve of non-zero genus, termed "basic" algorithm, has been proposed by A. N. Skorobogatov and S. G. Vlăduţ in the article entitled "*On the Decoding of Algebraic-Geometric Codes*", IEEE Trans. Inform. Theory, vol. 36 no. 5, pages 1051 to 1060, November 1990). That algorithm comprises:

a) constructing a "syndromes matrix" S of dimension (n−k)×(n−k), of which each coefficient $S_{ij}$, where j is less than or equal to a "boundary" value w(i), is equal to a judiciously chosen linear combination of the elements $s_v$ (v=1,2, ..., n−k) of the syndrome s, the coefficients $S_{ij}$ beyond the boundary being undetermined; it is conveniently arranged for the order of the lines of that syndromes matrix S to be such that the function w(i) is decreasing, that is to say that $w(i) \geq w(i+1)$ for all i=1, 2, ..., n−k−1;

b) considering the system of linear equations $$\sum_{i=1}^{\beta} l_i S_{ij} = 0, \text{ for } j = 1, 2, \ldots, w(\beta), \qquad (1)$$

where the unknowns $l_i$ belong to the same alphabet of symbols as the elements of the codewords, and where $\beta$ is an integer between 1 and (n−k) such that the system permits a non-trivial solution (that is to say a solution in which the coefficients $l_i$ are not all zero), and determining the values of the coefficients $l_i$ corresponding to the smallest possible value of $\beta$, which will be denoted $\lambda$;

c) calculating the roots of the "error-locating polynomial"

$$\Lambda(x, y) \equiv \sum_{i=1}^{\lambda} l_i h_i(x, y), \qquad (2)$$

these roots comprising all the pairs (x,y) corresponding to positions of the received word for which the component in that position has suffered a transmission error; and d) correcting the erroneous symbols of the received word of which the position is now known.

The "basic" algorithm guarantees a solving capability at least equal to $\Delta = n-k-2g$. However, the minimum distance d for an algebraic geometric code is at least equal to (n−k+1−g). It is thus clear that the basic algorithm is "sub-maximum", and this is all the more so the greater the genus g of the algebraic curve.

With the aim of improving the solving capability, Skorobogatov and Vlăduț proposed, in the same article cited above, a "modified" version of the "basic" algorithm. This "modified" algorithm has a solving capability at least equal to $\Delta=n-k-g-s$, where s is a parameter dependent on the algebraic curve chosen, which may furthermore sometimes be zero (this is the case for example for so-called "hyperelliptic" algebraic curves.

Algorithms are also known (which may be maximum or sub-maximum according to the manner in which they are implemented) which operate according to an iterative principle: each new iteration of such an algorithm uses an additional component of the syndromes vector $s=H \cdot r^T$.

An example of such an iterative decoding algorithm is disclosed in the article by M. Sakata et al. entitled "*Generalized Berlekamp-Massey Decoding of Algebraic-Geometric Codes up to Half the Feng-Rao Bound*" (IEEE Trans. Inform. Theory, vol 41, pages 1762 to 1768, November 1995) This algorithm can be viewed as a generalization of the Berlekamp-Massey algorithm to algebraic geometric codes defined on a curve of non-zero genus.

Another example of an iterative decoding algorithm has been disclosed by M. O'Sullivan in the article "*A Generalization of the Berlekamp-Massey-Sakata Algorithm*" (preprint 2001).

For any received word r, the set of error locating polynomials defined above associated with the transmission errors affecting that word is termed is termed a "Gröbner ideal". It is possible to generate this Gröbner ideal by means of a finite set of polynomials which constitutes what is known as a "Gröbner basis" of the ideal. The O'Sullivan algorithm which has just been cited produces such a Gröbner basis from a matrix S* obtained by "extending" the matrix S, that is to say by calculating the value of certain elements $S^*_{ij}$, for j greater than w(i). This extension is possible each time the number of errors in the received word is less than or equal to $(n-k+1-g)/2$.

When the number of errors in the received word is less than or equal to $(n-k+1-g)/2$, it is in general necessary to know further elements of the syndromes matrix than those obtained from the components of the error syndromes vector s, to be able to correct those errors. It is fortunately possible to calculate these elements of "unknown" value by a method comprising a certain number of "majority decisions", for example by using the "Feng-Rao algorithm". This algorithm, the essential object of which is to extend the matrix S by providing the value of at most g "unknown" elements per line of S, is disclosed in the article by G.-L. Feng and T. R. N. Rao entitled "*Decoding Algebraic-Geometric Codes up to the Designed Minimum Distance*" (IEEE Trans. Inform. Theory, vol. 39, No. 1, January 1993); more details about this algorithm are given below.

It will be noted that the calculation of the elements of unknown value may either be performed prior to the decoding algorithm (this is normally the case for the Sakata algorithm mentioned above, which also uses the "extended" matrix S*), or be integrated with the steps of the decoding algorithm (this is the case for the O'Sullivan algorithm).

Thus let S* be the syndromes matrix so "extended", and consider the system of linear equations $$\sum_{i=1}^{\mu} l_i S^*_{ij} = 0, \text{ for } j=1, 2, \ldots, w^*(\mu), \tag{1*}$$

in which the unknown values $l_i$ are to be found in the same alphabet as the symbols of the codewords, and in which u is such that for $j=1, \ldots, w^*(\mu)$, $S^*_{\mu j}$ is known, either directly from the components of the syndromes vector, or indirectly by using an algorithm for calculating the unknown matrix elements (the similarity will of course have been noted between that equation (1*) and the equation (1) used in the "basic" algorithm; in general, it is found that $w^*(\lambda)>w(\lambda)$, in other words, the "boundary" is pushed further back when S and S* are compared).

For any non-trivial solution of the system (1*), that is to say a solution where the coefficients $l_i$ are not all zero, the polynomial $$\Lambda(x, y) \equiv \sum_{i=1}^{\mu} l_i h_i(x, y) \tag{2*}$$

is an error locating polynomial.

Now consider the case in which the number of errors is greater than $(n-k+1-g)/2$. The "majority decision" algorithms, such as the Feng-Rao algorithm, are not then always capable of providing an adequate value for the unknown elements of S, and consequently, a decoding algorithm using the values of those matrix elements cannot be used.

In general terms, the principle of iterative decoding (such as in the algorithms cited by way of example above) is the following. Each iteration, except for the last, of an iterative decoding algorithm uses a sub-matrix of the matrix S*. Such an iteration then provides a certain number of polynomials which, like the true error locating polynomials of equation (2*), are constituted by a linear combination of monomials $h_i$, but for which it is not certain that the common roots include all the erroneous positions of the received word r. In other words, the status of error locating polynomials is guaranteed for all the polynomials obtained by the algorithm only provided that the number of errors is less than or equal to $(n-k+1-g)/2$ and that the iterations are continued right to the end, which requires the use of the elements of matrix $S^*_{ij}$ where $j>w(i)$.

It is for this reason that, according to the state of the art, an error is considered impossible to correct for which those elements of the matrix S* are required but cannot be calculated.

SUMMARY OF THE INVENTION

The inventors propose, to in a natural manner, to generalize the concept of "iterative" algorithm to the concept of "two-stage" algorithm. A two-stage algorithm will be defined, in the context of the present invention, as being a decoding algorithm for algebraic geometric code comprising:
- a "first stage" only using in the matrix S* the sub-matrix S (obtained "directly" from the components of the syndromes vector s), to produce a certain number of linear combinations of monomials $h_i$ which will be referred to as "first stage locating candidates", and
- a "second stage" using elements of the matrix S* situated beyond the boundary w, to eventually produce a certain number of linear combinations of monomials $h_i$, which, when the number of errors in the received word is less than or equal to $(n-k+1-g)/2$, are true locating polynomials.

It will be noted in passing that, when the number of errors is less than or equal to $(n-k+1-2g)/2$, the locating candidate of the first stage given in equation (2), which corresponds to the smallest value of β of equation (1), is a true locating polynomial (the other first stage locating candidates not then always being true locating polynomials).

Be that as it may, the inventors have discovered that, contrary to what could be thought at first sight, it is in fact possible in certain favorable cases (see below), to find the erroneous positions of the received word when the number of errors is greater than (n−k+1−g)/2, even if it is not possible to calculate all the elements of S* required by a two-stage algorithm to perform that correction.

Thus, according to a first aspect, the present invention relates to a method of decoding a one-point algebraic geometric code of dimension k and length n, in which, in order to identify the position of the errors in a received word, the syndromes matrix S, of dimension (n−k)×(n−k) is defined, of which the elements $S_{ij}$ of each line i are calculated, for j between 1 and w(i), where the boundary w is a decreasing function, using the syndrome s of that received word, said method being remarkable in that it comprises the following steps:

implementing a two-stage decoding algorithm applied to the matrix S, which gives a set of first stage locating-candidate polynomials, and searching in that set of first stage locating-candidate polynomials for whether there is one in X only, and in that, if there is such a polynomial, it is used as locating polynomial in X.

The expression "locating polynomial in X" is used to mean a polynomial in X of which the roots comprise all the values of x such that there is at least one value of y for which the pair (x,y) corresponds to an erroneous position in the received word.

This is because the inventors have discovered that if by this method a polynomial in X is obtained, then that polynomial is a true locating polynomial, provided that the number of aggregates (as defined above) comprising at least one position corresponding to an erroneous component is less than or equal to $n_X/2$, where $n_X$ designates the number of monomials $h_i$ constituted solely by a power of X.

In the case in which the number of aggregates containing at least one erroneous component is greater than $n_X/2$, it is not guaranteed that, if a locating polynomial in X is obtained, the error location resulting therefrom will be correct. However, it is observed that, in such a case, the known decoding methods will also be incapable of correcting the transmission errors in the received word, in as much as the total number of errors is greater than (n−k+1−g)/2.

According to particular features, the processing of the received word is continued with steps of a method of error correction by aggregates, which identifies the erroneous components of the received word among the aggregates determined by calculating the roots of said locating polynomial in X, and calculates an estimated value for those components. For example, to that end the decoding method already proposed in U.S. patent application Ser. No. 10/746,144 (now published as U.S. 2004/0194006 A1) assigned to CANON K.K. and incorporated therein by reference could conveniently be used.

According to a second aspect, the invention relates to various devices.

Thus, firstly, it relates to an error correction device for the decoding of a one-point algebraic geometric code of dimension k and length n, in which, in order to identify the position of the errors in a received word, the syndromes matrix S, of dimension (n−k)×(n−k) is defined, of which the elements $S_{ij}$ of each line i are calculated, for j between 1 and w(i), where the boundary w is a decreasing function, using the syndrome s of the received word. This error correction device is remarkable in that it further comprises means for:

implementing a two-stage decoding algorithm applied to the matrix S, which gives a set of first stage locating-candidate polynomials, and searching in that set of first stage locating-candidate polynomials for whether there is one in X only, as well as means for using such a polynomial, if there is one, as locating polynomial in X.

According to particular features, the error correction device further comprises a device for error correction by aggregates adapted to continue the processing of the received word, said device for error correction by aggregates comprising means for identifying the erroneous components of the received word among the aggregates determined by calculating the roots of said locating polynomial in X, and means for calculating an estimated value for those components.

The advantages of these error correction devices are essentially the same as those of the methods complementary thereto described succinctly above.

The invention also concerns, secondly, a decoder comprising:

at least one error correction device as described succinctly above, and at least one redundancy suppression device.

The invention also relates to:

an apparatus for receiving encoded digital signals comprising a decoder as succinctly described above, as well as means for demodulating said encoded digital signals, a computer system comprising a decoder as succinctly described above, and further comprising at least one hard disk, and at least one means for reading that hard disk.

a non-removable data storage means comprising computer program code instructions for the execution of the steps of any one of the methods succinctly described above, a partially or wholly removable data storage means comprising computer program code instructions for the execution of the steps of any one of the methods succinctly described above, and a computer program containing instructions such that, when said program controls a programmable data processing device, said instructions lead to said data processing device implementing one of the methods succinctly described above.

The advantages provided by this decoder, this reception apparatus, this computer system, these data storage means and this computer program are essentially the same as those provided by the methods according to the invention.

BRIEF DESCRIPTION OF THE DRAWINGS

Other aspects and advantages of the invention will emerge from a reading of the following detailed description of particular embodiments, given by way of non-limiting example. The description refers to the accompanying drawings, in which:

FIG. 2 is a list of monomials which form a basis for a function vector space in two variables associated with an algebraic geometric code presented here by way of example, FIG. 3 shows, for a numerical example of application of the method according to the invention, the sub-matrix comprising the 17 first lines and the 17 first columns of the syndromes matrix.

DETAILED DESCRIPTION OF A PREFERRED EMBODIMENT

Figure 1:
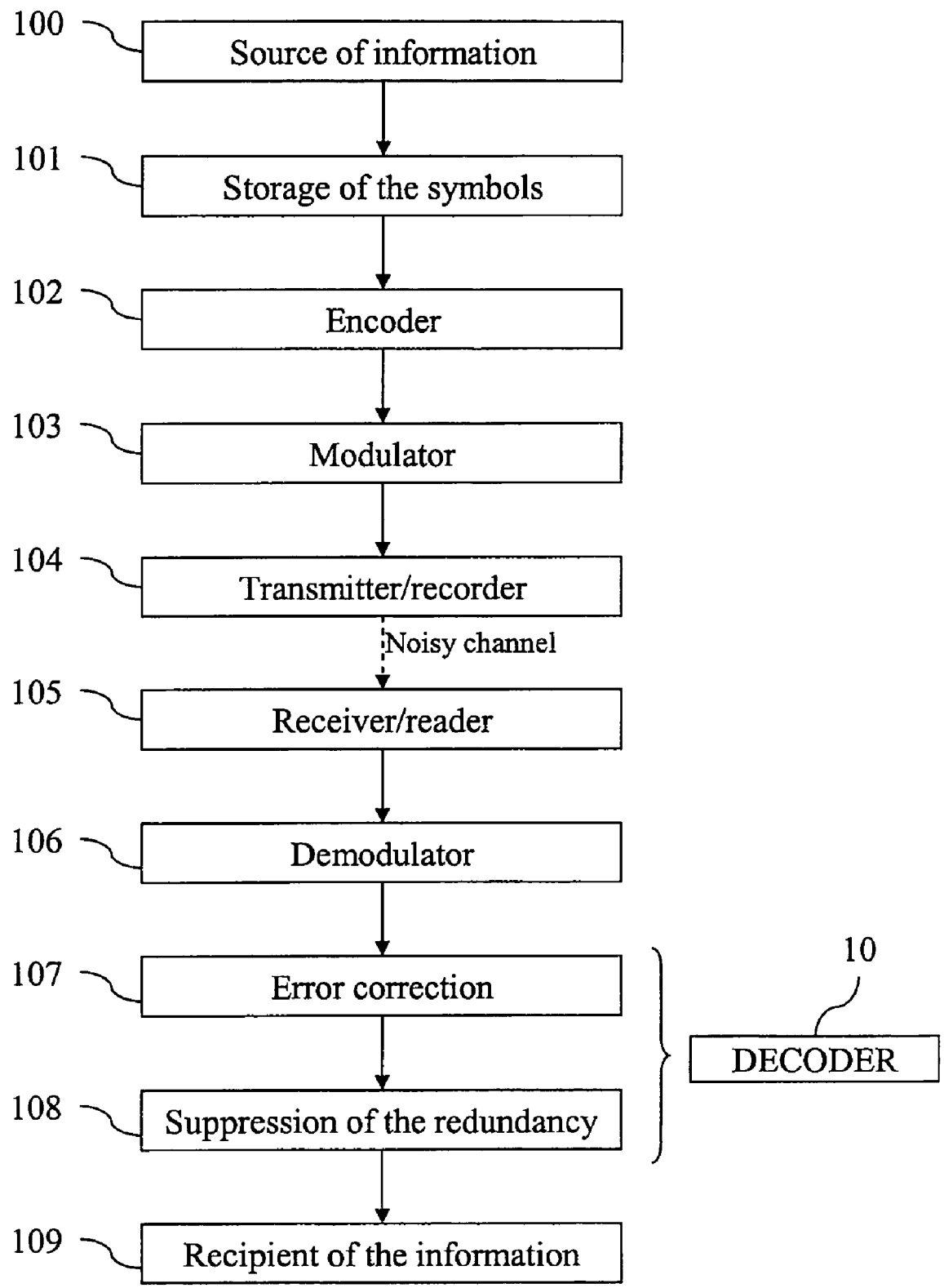
FIG. 1 is a block diagram of a system for transmitting information using a decoder according to the invention.

FIG. 1 is a block diagram of a system for transmitting information using a channel encoding and decoding according to the invention.

The function of this system is to transmit information of any nature from a source 100 to a recipient or user 109. First of all, the source 100 puts this information into the form of symbols belonging to a certain alphabet (for example bytes), and transmits these symbols to a storage unit 101, which accumulates the symbols so as to form sets each containing k symbols. Next, each of these sets is transmitted by the storage unit 101 to an encoder 102 which incorporates the redundancy therein, so as to construct a codeword of length n belonging to the chosen code.

The codewords so formed are next transmitted to a modulator 103, which associates a modulation symbol (for example, a complex amplitude) with each symbol of the codeword. Next, these modulation symbols are transmitted to a transmitter or to a recorder 104, which inserts the symbols in a transmission channel. This channel may for example be constituted by a wired transmission or wireless transmission such as a radio signal, or by storage on an appropriate carrier such as a DVD or a magnetic tape. This transmission arrives at a receiver or a reader 105, after having been affected by a "transmission noise" whose effect is to modify or delete certain of the modulation symbols at random.

The receiver or reader 105 then transmits these symbols to the demodulator 106, which transforms them into symbols of the alphabet mentioned previously, of which each set constitutes a "received word". The received word is next processed by an error correction unit 107, which implements a decoding method according to the invention, so as to provide an "associated codeword". Next, this associated codeword is transmitted to a redundancy suppression unit 108, which extracts from it k information symbols by implementing a decoding algorithm that is the reverse of that implemented by the encoder 102. Finally, these information symbols are supplied to their recipient 109.

Units 107 and 108 can be considered to form conjointly a "decoder" 10.

The method of error correction according to the invention will now be illustrated, with the aid of a numerical example. Note that this example does not necessarily constitute a preferred choice of parameters for the encoding or decoding. It is provided here to enable the person skilled in the art to understand more easily the operation of the method according to the invention.

An algebraic geometric code will thus be considered of dimension 44 and length 60 defined as follows.

The alphabet of the symbols is constituted by the 16 elements of the Galois field $F_{16}$. The following "algebraic curve" is then considered of genus $g=6$ constituted by the set of the solutions (x, y) of the equation with two unknowns $$Y^4 + Y + X^5 = 0 \quad (3)$$

on $F_{16}$. These solutions, of which there are 64, constitute the "finite points of the curve" (the curve also contains a point at infinity denoted $P_\infty$). To form the locating set, elimination from that set of 64 finite points which are solutions of equation (3) will be made (for convenience) of the four points for which the value of x or of y is zero. Each point $P_j$ of the locating set then serves to identify the $j^{th}$ element of any codeword. The number of such points here being equal to 60, the length n of the code is thus itself also equal to 60.

Next, the vector space $L(m\,P_\infty)$ is considered of polynomials in X and Y with coefficients in $F_{16}$ of which solely the poles are situated in $P_\infty$, and are of order less than or equal to m, where m is a strictly positive integer (it is thus a so-called "one-point" algebraic geometric code). This vector space, which is of dimension greater than or equal to $(m-g+1)$ (equal if $m>2g-2$), has a base constituted by the monomials $h_i \equiv X^s Y^t$, where s is a positive integer or zero, t is an integer between 0 and 3, $4s+5t \leq m$, and $i=1, \ldots, n-k$. This quantity $\rho(h_i) \equiv 4s+5t$ is usually called the "weight" of the monomial $h_i$.

Take for example: $m=21$; a set of monomials $h_i$ ($i=1, \ldots, 16$) is then obtained of which the list is given in FIG. 2. It is found here that $n_X=6$. This is because there are six of these monomials $h_i$ which are equal to a power of X, i.e. the monomials: $h_1=1$, $h_2=X$, $h_4=X^2$, $h_7=X^3$, $h_{11}=X^4$, and $h_{15}=X^5$.

Finally, the parity check matrix H of the code is defined in the following manner the element in line i and column j of that matrix is equal to the value taken by the monomial $h_i$ for the coordinates of the point $P_j$ of the algebraic curve. Thus, $n-k=16$, and so $k=44$. The minimum distance d of this code is at least equal to $n-k+1-g=11$. For this minimum distance, it is possible to correct $INT[(11-1)/2]=5$ symbols having suffered a transmission error.

The code having been chosen, it will now be shown how to build the syndromes matrix S.

Consider the 16×16 products of some function $h_i$ by some function $h_j$, these products being defined modulo the equation of the algebraic curve given by equation (3).

Some of these products are equal to an element of the vector space $L(m\,P_\infty)$ (in other words, the weight of each of these products is less than or equal to $m=21$). For example:

$$h_3 \cdot h_4 = Y \cdot X^2 = YX^2 = h_8, \quad h_6 \cdot h_6 = Y^2 \cdot Y^2 = Y^4 = X^5 + Y = h_{15} + h_3.$$

In such cases, we write $$h_i \cdot h_j = \sum_{v=1}^{n-k} \lambda_v h_v,$$

and the matrix element $S_{ij}$ is defined by $$S_{ij} = \sum_{v=1}^{n-k} \lambda_v s_v \quad (4)$$

where, it may be recalled, the $s_v$ designate the (n−k) components of the error syndromes vector s.

The order of the functions $h_i$ has been chosen such that, for any value of i, the product of $h_i$ by $h_j$ belongs to $L(m\,P_\infty)$ for all the values of j from 1 to a certain limit w(i), where the function w(i) is a decreasing function.

On the other hand, certain products $h_i \cdot h_j$ do not belong to $L(m\,P_\infty)$. This is the case, for example, for $h_6 \cdot h_7 = Y^2 X^3$. In such cases, the value of the corresponding element $S_{ij}$ is not known beforehand. The only elements of the matrix S obtained up to now are those for which j is less than or equal to w(i). This function w thus represents a "boundary" between the elements calculated according to equation (4), which fill the upper left corner of the matrix S, and the elements that are still undetermined of that matrix.

Use can then be made, for example, of the Feng-Rao algorithm, which operates in the following manner. For any undetermined position of the syndromes matrix, examination is made to see whether there is a value (symbol of $F_q$) which minimizes the rank of the sub-matrix of S* subtended by that position; if one is found, it is said that that position is said to have "the right to vote" and that that value is the value "chosen" by that position; all the positions (i,j) of S*, for any fixed weight p, are then considered which have the right to vote and such that $\rho(h_i)+\rho(h_j)=\rho$; among those positions, it is then determined what is, modulo the equation of the algebraic curve, the value most often "chosen" (hence the expression "majority decision"); this value is said to be "elected" and it is used to calculate, modulo the equation of the algebraic curve, the values of all the positions of S* of weight $\rho$, whether these positions have the right to vote or not. This procedure must be carried out in successive steps defined by the increasing values of the weight $\rho$, without which certain elements of a sub-matrix of S* subtended by an element which it is sought to determine and others than that element to determine, could still be undetermined. (in practice the implementation of the Feng-Rao algorithm becomes simplified when it is included in the algorithm for searching for the error locating polynomials, as is for example the case in the O'Sullivan algorithm.)

A numerical example of application of the invention to the code of length 60 and dimension 44 on $F_{16}$ introduced above will now be presented. For this, let the choice of primitive element of $F_{16}$ be a root $\alpha$ of the equation $$Z^4+Z+1=0$$

of coefficients in $F_2$. Assume then that the received word r produces the following error syndromes vector (of $n-k=16$ components):

$$\underline{s}=[\alpha^7,\alpha^2,\alpha^{10},\alpha^3,1,\alpha^6,1,\alpha^{14},1,\alpha^2,\alpha,\alpha^5,\alpha^{11},\alpha^{14},\alpha^7,0].$$

The syndromes matrix S corresponding to that syndrome $\underline{s}$ is represented in FIG. 3.

The reader will be able to verify that, in this case, none of the unknown elements of the matrix S can be calculated. A conventional decoding algorithm, such as the O'Sullivan algorithm, would then decree that it is impossible to correct that word r.

Now let there be applied a conventional two-stage decoding algorithm to the matrix S, in accordance with the invention. Considering for example an algorithm of iterative type: after the first 16 iterations (which only use the "known" elements of the matrix S) the following four polynomials are obtained:

$$C_1 \equiv \alpha^9 \alpha^{11} X + \alpha^7 X^2 + X^3 (\mu=7),$$

$$C_2 \equiv 1 + \alpha^6 Y + X^2 + \alpha^5 XY + X^2 Y (\mu=8),$$

$$C_3 \equiv \alpha^{13} X + \alpha^{14} X^2 + \alpha^3 X^2 Y + XY^2 (\mu=9), \text{ and}$$

$$C_4 \equiv \alpha^4 X + \alpha^{10} X^2 + \alpha^2 XY + \alpha^8 X^2 Y + \alpha^{13} Y + \alpha^3 XY^2 + Y^3 \\ (\mu=10),$$

in accordance with equation (2*). These polynomials are "locating-candidates" within the meaning of the invention since, at this point in the decoding algorithm, it is impossible to implement a $17^{th}$ iteration, since that would use an element of unknown value of the syndromes matrix.

Note then that one of the locating candidates, i.e. $C_1$, is a polynomial in X alone (that is to say that the variable Y does not appear therein). As this polynomial is of degree 3, the number of error contaminated aggregates is equal to 3, a number which is found to be equal to $n_X/2$. $C_1$ can thus be used as locator of errors in aggregates, and a method of correcting erroneous values can be implemented also working by aggregates, as per US patent application Ser. No. 10/746,144. This implementation makes it possible to determine that the transmission errors ê(x,y) in the received word r are the following:

| x | 1 | $\alpha^3$ | $\alpha^6$ | 1 | $\alpha^3$ | $\alpha^6$ | 1 | $\alpha^3$ | $\alpha^6$ |
|---|---|---|---|---|---|---|---|---|---|
| y | $\alpha$ | $\alpha^2$ | $\alpha^4$ | $\alpha^4$ | $\alpha^8$ | $\alpha$ | $\alpha^8$ | $\alpha^4$ | $\alpha^2$ |
| ê(x, y) | $\alpha^3$ | $\alpha^5$ | 1 | $\alpha^{14}$ | $\alpha^{12}$ | $\alpha^2$ | $\alpha^8$ | $\alpha^7$ | $\alpha^3$ |

Thus, by virtue of the invention, it will have been possible to correct 9 errors, distributed between three aggregates, by using as a "locating" step a part of a decoding algorithm conventionally adapted to use the calculation of the unknown syndromes.

Figure 4:
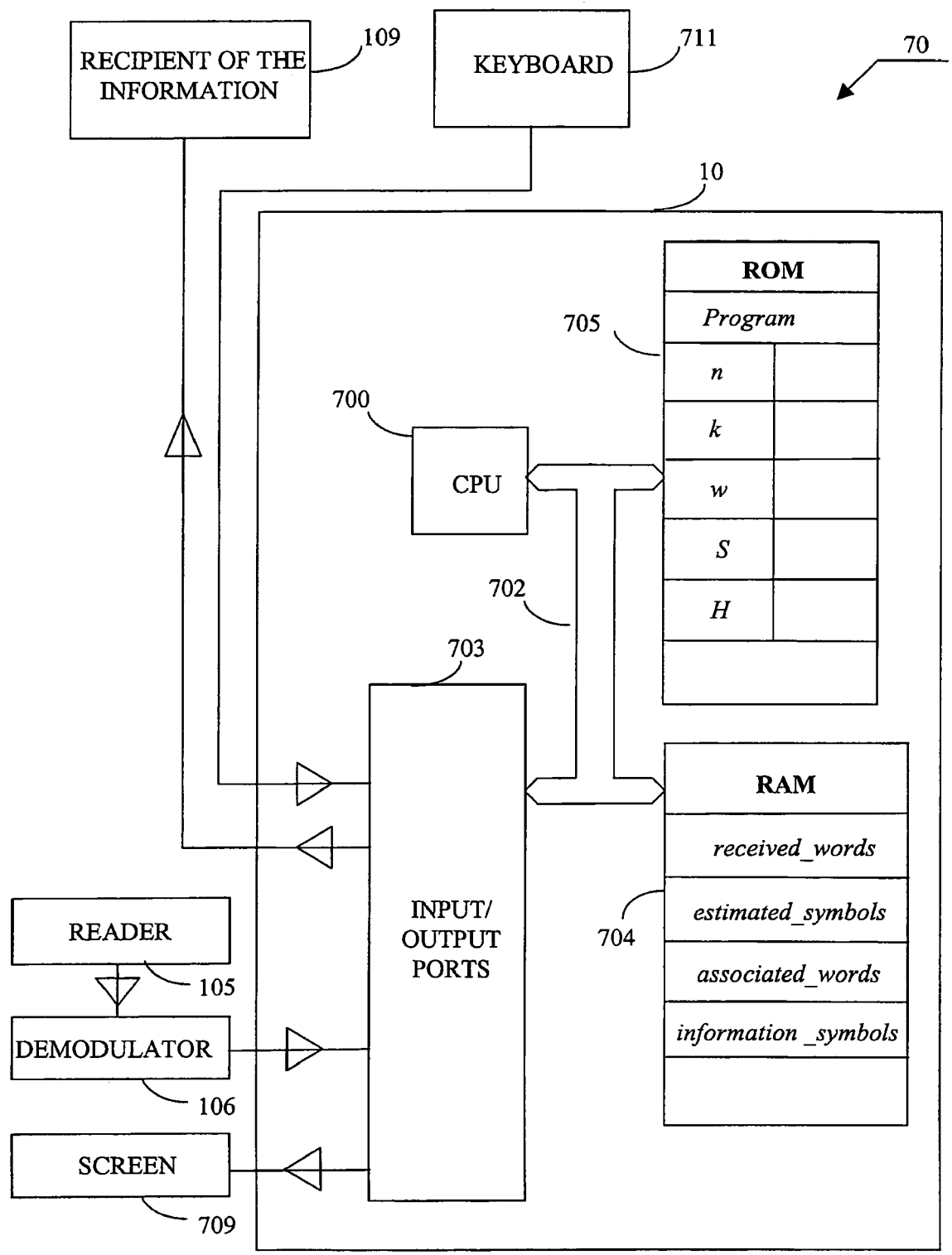
FIG. 4 shows an apparatus for receiving digital signals incorporating a decoder according to the invention.

The block diagram of FIG. 4 represents an apparatus for receiving digital signals 70 incorporating the decoder 10. This apparatus 70 comprises a keyboard 711, a screen 709, a recipient of external information 109, a data reader 105 and a demodulator 106, conjointly connected to input/output ports 703 of the decoder 10 which is produced here in the form of a logic unit.

The decoder 10 comprises, connected together by an address and data bus 702:
 a central processing unit 700,
 a random access memory (RAM) 704,
 read only memory (ROM) 705; and
 said input/output ports 703.

Each of the elements illustrated in FIG. 4 is well known to the person skilled in the art of microcomputers and mass storage systems and, more generally, of information processing systems. These known elements are therefore not described here. It should be noted, however, that:
 the information recipient 109 could be, for example, an interface peripheral, a display, a modulator, an external memory or other information processing system (not shown), and could be adapted to receive sequences of signals representing speech, service messages or multimedia data in particular of the IP or ATM type, in the form of sequences of binary data,
 the reader 105 is adapted to read data recorded on a carrier such as a magnetic or magneto-optic disk.

The random access memory 704 stores data, variables and intermediate processing results, in memory registers bearing, in the description, the same names as the data whose values they store. The random access memory 704 contains in particular the following registers:
 registers "received_words", in which the received words are kept,
 a register "estimated symbols", in which are stored the symbols from a received word in course of correction,
 a register "associated_words", in which are stored the symbols of the "associated codewords", and
 a register "information_symbols", in which are stored the symbols resulting from the redundancy suppression.

The read only memory 705 is adapted to store, in registers which, for convenience, have the same names as the data which they store:
 the operating program of the central processing unit 700, in a register "program", the length of each codeword in a register "n", the number of information symbols in each codeword, in a register "k", the list of the values of w(i) for $1 \leq i \leq n-k$, such as illustrated in FIG. 2, in a register "w", the list of the coefficients of the syndromes matrix established in accordance with equation (4) in a register "S", and the parity check matrix of the code, in a register "H", An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

What is claimed is:

1. A method of decoding a one-point algebraic geometric code of dimension k and length n, said algebraic geometric code being constructed on a locating set of which elements are pairs (x, y) that are solutions of an algebraic equation with two unknowns X and Y defining a curve of non-zero genus, in which, in order to identify a position of errors in a received word, a syndromes matrix S, of dimension (n−k)×(n−k) is defined, of which elements $S_{ij}$ of each line i are calculated, for j between 1 and w(i), wherein the boundary w is a decreasing function, using a syndrome s of the received word, said method comprising the following steps:

producing the syndromes matrix S from the received word;

implementing a first stage of a two-stage decoding algorithm applied to the matrix S, to obtain a set of first stage locating-candidate polynomials including polynomials in X and Y;

searching in the set of first stage locating-candidate polynomials for whether there is a polynomial in X only; and decoding the received word, if there is a polynomial in X only, using the polynomial in X only as a locating polynomial in X.

2. A method according to claim 1, further comprising steps of a method of error correction by aggregates, which identifies the erroneous components of the received word among the aggregates determined by calculating roots of the locating polynomial in X, and calculates an estimated value for the erroneous components.

3. A decoding method according to claim 1, wherein said two-stage decoding algorithm is an iterative algorithm.

4. Non-removable data storage means, comprising computer program code instructions for the execution of the steps of a method according to claim 1.

5. Partially or wholly removable data storage means, comprising computer program code instructions for the execution of the steps of a method according to claim 1.

6. A computer-readable medium storing a computer program, having instructions such that, when said program controls a programmable data processing device, said instructions lead to said data processing device implementing a method according to claim 1.

7. A device for correcting errors for the decoding a one-point algebraic geometric code of dimension k and length n, said algebraic geometric code being constructed on a locating set of which elements are pairs (x, y) that are solutions of an algebraic equation with two unknowns X and Y defining a curve of non-zero genus, in which, in order to identify a position of errors in a received word, a syndromes matrix S, of dimension (n−k)×(n−k) is defined, of which the elements of each $S_{ij}$ of each line i are calculated, for j between 1 and w(i) wherein the boundary w is a decreasing function, using a syndrome s of the received word, said device comprising:

means for implementing a first stage of a two-stage decoding algorithm applied to the matrix S, to obtain a set of first stage locating-candidate polynomials including polynomials in X and Y; and means for searching in the set of first stage locating-candidate polynomials for whether there is a polynomial in X only, and using a polynomial in X only, if there is one, as a locating polynomial in X.

8. A device for correcting errors according to claim 7, further comprising a device for error correction by aggregates adapted to continue the processing of the received word, said device for error correction by aggregates comprising means for identifying the erroneous components of the received word among the aggregates determined by calculating roots of the locating polynomial in X, and means for calculating an estimated value for the erroneous components.

9. A decoder comprising:

at least one device for correcting errors according to claim 8, and at least one redundancy suppression device.

10. An apparatus for receiving encoded digital signals, comprising a decoder according to claim 9, and means for demodulating the encoded digital signals.

11. A computer system, comprising a decoder according to claim 9, and:

at least one hard disk, and at least one means for reading the hard disk.

12. A device for correcting errors according to claim 7, wherein said two-stage decoding algorithm is an iterative algorithm.

13. A method of correcting an erroneous symbol of a received word coded according to an algebraic geometric code constructed on a locating set of which elements are pairs (x, y) that are solutions of an algebraic equation with two unknowns X and Y defining a curve of non-zero genus, said method comprising the steps of:

producing a syndrome matrix from the received word;

obtaining candidates of error-locating polynomials including polynomials with two variables by applying a predetermined decoding algorithm to the syndrome matrix;

selecting a polynomial with a single variable from the candidates of error-locating polynomials;

determining a position of an erroneous symbol in the received word by using the selected polynomial as an error-locating polynomial; and correcting the erroneous symbol at the determined position in the received word.

14. A method according to claim 13, wherein the predetermined decoding algorithm is an iterative algorithm.

15. A method according to claim 13, wherein the position of the erroneous symbol is determined by calculating a root of the error-locating polynomial.

16. A method according to claim 13, wherein the predetermined decoding algorithm is applied by using known elements of the syndrome matrix.

17. A computer-readable program for controlling a computer, said program comprising codes for causing the computer to perform the method according to claim 13.

18. A device for correcting an erroneous symbol of a received word coded according to an algebraic geometric code constructed on a locating set of which elements are pairs (x, y) that are solutions of an algebraic equation with two unknowns X and Y defining a curve of non-zero genus, said device comprising:

production means for producing a syndrome matrix from the received word;

obtaining means for obtaining candidates of error-locating polynomials including polynomials with two variables by applying a predetermined decoding algorithm to the syndrome matrix;

selection means for selecting a polynomial with a single variable from the candidates of error-locating polynomials;

determination means for determining a position of an erroneous symbol in the received word by using the selected polynomial as an error-locating polynomial; and correction means for correcting the erroneous symbol at the determined position in the received word.

* * * * *

UNITED STATES PATENT AND TRADEMARK OFFICE
CERTIFICATE OF CORRECTION

| | |
|---|---|
| PATENT NO. | : 7,392,454 B2 |
| APPLICATION NO. | : 11/012092 |
| DATED | : June 24, 2008 |
| INVENTOR(S) | : Philippe Piret et al. |

It is certified that error appears in the above-identified patent and that said Letters Patent is hereby corrected as shown below:

<u>COLUMN 4</u>

Line 18, "S. G. Vl" should read --S. G. Vlăduţ--; and
    Line 19, "ădut" should be deleted.

<u>COLUMN 5</u>

Line 2, "Vlădut" should read --Vlăduţ--.

<u>COLUMN 6</u>

Line 2, "which u" should read --which µ--; and
    Line 35, "word r." should read --word <u>r</u>.--.

<u>COLUMN 10</u>

Line 24, "manner the" should read --manner: the--.

<u>COLUMN 12</u>

Line 56, ""estimated symbols"," should read --""estimated_symbols",''--.

UNITED STATES PATENT AND TRADEMARK OFFICE
CERTIFICATE OF CORRECTION

PATENT NO. : 7,392,454 B2
APPLICATION NO. : 11/012092
DATED : June 24, 2008
INVENTOR(S) : Philippe Piret et al.

It is certified that error appears in the above-identified patent and that said Letters Patent is hereby corrected as shown below:

COLUMN 13

Line 66, "elements of" should read --elements--; and
Line 67, "each $S_{ij}$" should read --$S_{ij}$--.

Signed and Sealed this

Eighteenth Day of November, 2008

JON W. DUDAS
*Director of the United States Patent and Trademark Office*